United States Patent [19]

Schulhof

[11] Patent Number: 4,610,024
[45] Date of Patent: Sep. 2, 1986

[54] AUDIO APPARATUS
[75] Inventor: Michael P. Schulhof, New York, N.Y.
[73] Assignee: Sony Corporation, Tokyo, Japan
[21] Appl. No.: 107,784
[22] Filed: Dec. 28, 1979
[51] Int. Cl.[4] ............................................... H04R 3/04
[52] U.S. Cl. .................................... 381/103; 333/28 R
[58] Field of Search ................. 179/1 D, 1 AT, 1 FS, 179/1 P, 1 G; 333/28 R, 28 T; 381/103

[56] References Cited
U.S. PATENT DOCUMENTS
4,118,601 10/1978 Yeap .................................... 179/1 D
4,340,780 7/1982 Odlen ................................... 179/1 D Primary Examiner—Joseph A. Popek
Attorney, Agent, or Firm—Lewis H. Eslinger; Alvin Sinderbrand

[57] ABSTRACT

An audio apparatus includes a signal generating circuit for generating a first electrical audio frequency signal corresponding to audio information received from a source, such as a phonograph turntable, tape recorder or FM/AM tuner. A loudspeaker generates an acoustic signal in response to the first audio frequency signal, and a microphone pick-up receives the acoustic signal for generating a corresponding second electrical audio frequency signal. A filter network then separates the first and second audio frequency signals into respective low, mid and high-frequency ranges, and three comparator circuits compare the first and second audio frequency signals in each frequency range and produce a respective error signal in each frequency range. A tone control or equalizing circuit then adjusts the levels of the several frequency ranges of the first audio frequency signal in response to the respective error signals, whereby to ensure accurate acoustic signal generation by the loudspeaker corresponding to the first audio frequency signal, regardless of room and loudspeaker design.

18 Claims, 2 Drawing Figures

AUDIO APPARATUS

BACKGROUND OF THE INVENTION

This invention relates generally to an audio apparatus and, more particularly, is directed to an audio apparatus which provides automatic tone balance of a reproduced acoustic signal.

Electronic audio apparatus for producing an acoustic signal from a record medium or other audio source is well known in the art. Typically, in such apparatus, electronic audio frequency signals are reproduced from an audio source, such as a phonograph, tape recording-/reproducing apparatus, FM/AM radio tuner, or the like, and supplied through an amplifying circuit to a loudspeaker for acoustic reproduction. That is, the output of the amplifying circuit is used to drive the loudspeaker to produce an acoustic signal in response thereto.

As is well known, a loudspeaker typically includes a diaphragm which has vibratory motion imparted thereof in response to the signal received from the amplifier, which vibratory motion produces a sound pressure wave which is heard by the listener as the reproduced sound or acoustic signal. However, because of varying factors in loudspeaker design, such as shape, size and construction, the reproduced acoustic signal does not always accurately reflect the audio signal it is designed to reproduce. Thus, variations in tonal quality may be readily apparent in the reproduced acoustic signal. Although manual tone controls are typically provided for adjusting the tonal quality of the signal applied to the loudspeaker, a loudspeaker may affect the tonal quality of an acoustic signal differently for audio signals reproduced from different sources. Therefore, the tone controls may have to be adjusted for different audio sources so that no fixed tone control setting can be made. Such variation in tonal quality is even more evident between loudspeakers of different design.

In like manner, variations in room geometry and dimensions greatly affect the sound balance and perceived tonality of the reproduced acoustic signal, even when the same loudspeaker is used. Such variations in tonal quality are even more evident when loudspeakers having different designs are used in rooms having different geometries and dimensions. Thus, individual listeners frequently find it difficult in deciding on the best combination of loudspeaker and room design to produce an accurately reproduced acoustic signal.

OBJECTS AND SUMMARY OF THE INVENTION

Accordingly, it is an object of this invention to provide an audio apparatus that avoids the above-described difficulties encountered with the prior art.

More particularly, it is an object of this invention to provide an audio apparatus which automatically balances the tonal quality of an acoustic signal generated by a loudspeaker so as to produce an accurately reproduced acoustic signal which compensates for variations in speaker design and room acoustics.

Another object of this invention is to provide an audio apparatus which automatically samples the reproduced acoustic signal produced by the loudspeaker for comparison with the electronic signal that had previously been supplied to the loudspeaker for producing that acoustic signal so as to automatically adjust the signal supplied to the loudspeaker to account for variations in loudspeaker and room design.

In accordance with an aspect of this invention, an audio apparatus includes signal generating means for generating a first electrical audio frequency signal corresponding to audio information received from a source, loudspeaker means for generating an acoustic signal in response to the first audio frequency signal, pick-up means receiving the acoustic signal for generating a corresponding second electrical audio frequency signal, automatic tone adjustment means for comparing the first and second audio frequency signals and producing a compared output signal, and control means for adjusting a characteristic of the first audio frequency signal in response tO the compared output signal, whereby to insure accurate acoustic signal generation by the loudspeaker means, regardless of room and loudspeaker means design. )

The above, and other, objects, features and advantages of the invention, will be apparent from the following detailed description of an illustrative embodiment of the invention which is to be read in connection with the accompanying drawings.

DETAILED DESCRIPTION OF A PREFERRED EMBODIMENT

Figure 1:
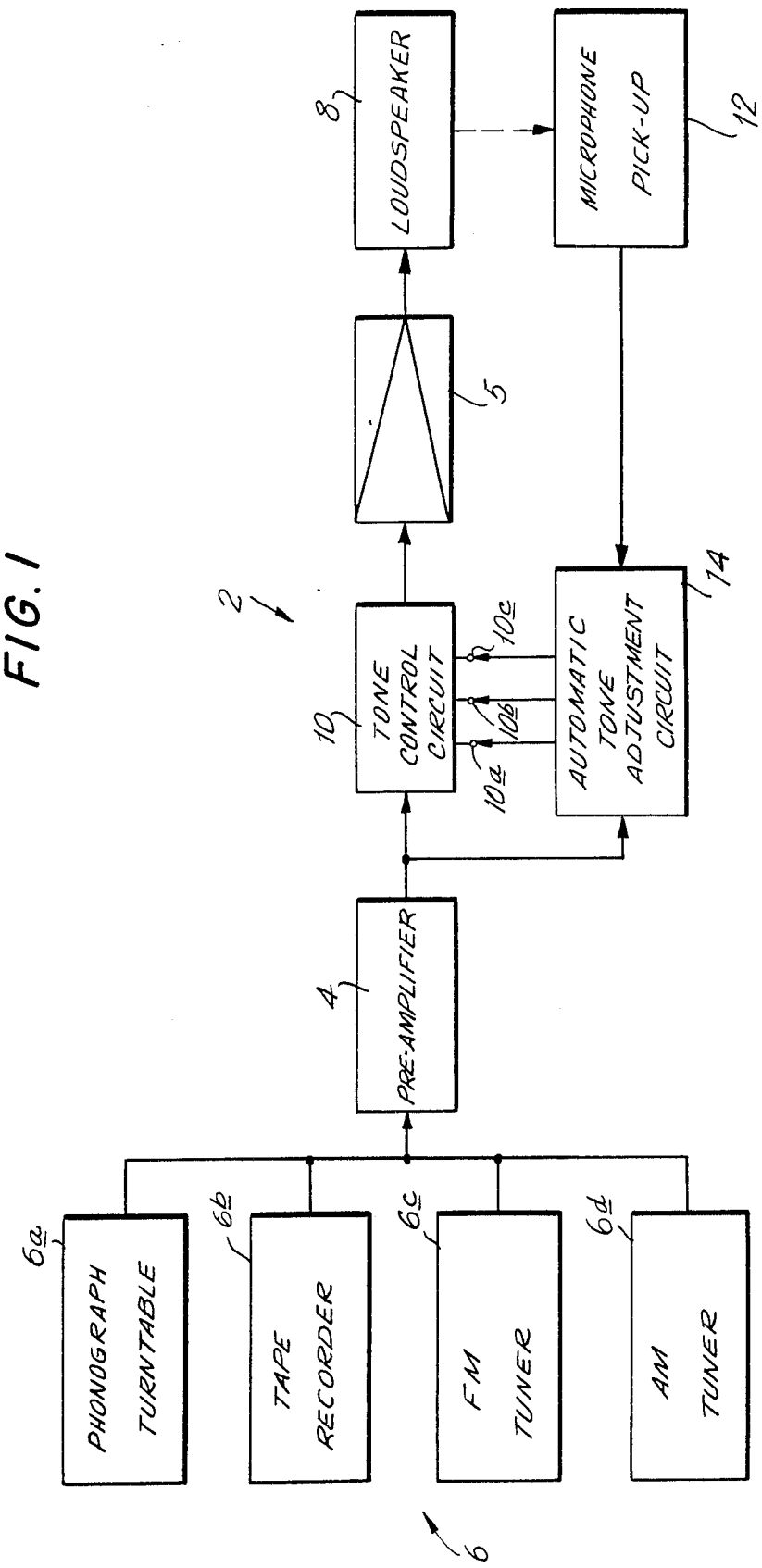
FIG. 1 is a block diagram of an audio apparatus according to this invention.

Referring to the drawings in detail, and initially to FIG. 1 thereof, an embodiment of an audio apparatus 2 according to the present invention is there shown to include a preamplifier 4 which receives an electrical audio frequency signal from an audio information source 6, which may include a selectively operative phonograph turntable 6a, tape recording/reproducing apparatus 6b, FM tuner 6c and AM tuner 6d. Preamplifier 4 amplifies and generates a first electrical audio frequency signal which is applied through an amplifier 5 to a loudspeaker 8 which then produces an acoustic signal in response to the first audio frequency signal. A tone control or equalizing circuit 10 is interposed between preamplifier 4 and amplifier 5 so as to adjust the tonal quality of the first electrical audio frequency signal from preamplifier 4. Thus, for example, tone control circuit 10 may adjust the relative levels between the low-, mid-, and high-frequency ranges of the first audio frequency signal.

As previously discussed, because of variations in room and loudspeaker design, it becomes almost impossible to continually and manually adjust the first audio frequency signal by means of tone control circuit 10. The present invention thus provides for automatic adjustment of the first audio frequency signal so that an acoustic signal is accurately matched to the information source signal. More particularly, in accordance with the present invention, a microphone pick-up 12 receives the generated acoustic signal from loudspeaker 8 and produces a corresponding second electrical audio frequency signal which is supplied to an automatic tone adjustment circuit 14, Automatic tone adjustment circuit 14 also receives the first electrical audio frequency signal from pre-amplifier 4 and compares this signal with the second audio frequency signal from pick-up 12 to provide a compared output or error signal which is then supplied to tone control circuit 10 for adjusting the tonal quality of the first audio frequency signal as applied therethrough to amplifier 5. Thus, if, because of variations in loudspeaker and room design, the generated acoustic signal from loudspeaker 8 does not accurately correspond to the audio information signal from source 6, automatic tone adjustment circuit 14 compares the actually reproduced second audio frequency signal with the desired first audio frequency signal to produce an error signal. This error signal is then used to control the tonal quality of the first audio frequency signal so that loudspeaker 8 generates an acoustic signal which accurately corresponds to the audio information from source 6. As shown in FIG. 1, tone control circuit 10 may have three input terminals 10a, 10b and 10c which correspond respectively to the low-, mid-, and high-frequency ranges. Automatic tone adjustment circuit 14 then supplies appropriate error signals to terminals 10a, 10b and 10c to adjust the gains as to the respective frequency bands of the first electrical audio frequency signal whereby tone control circuit 10 functions in an equalizing mode.

Figure 2:
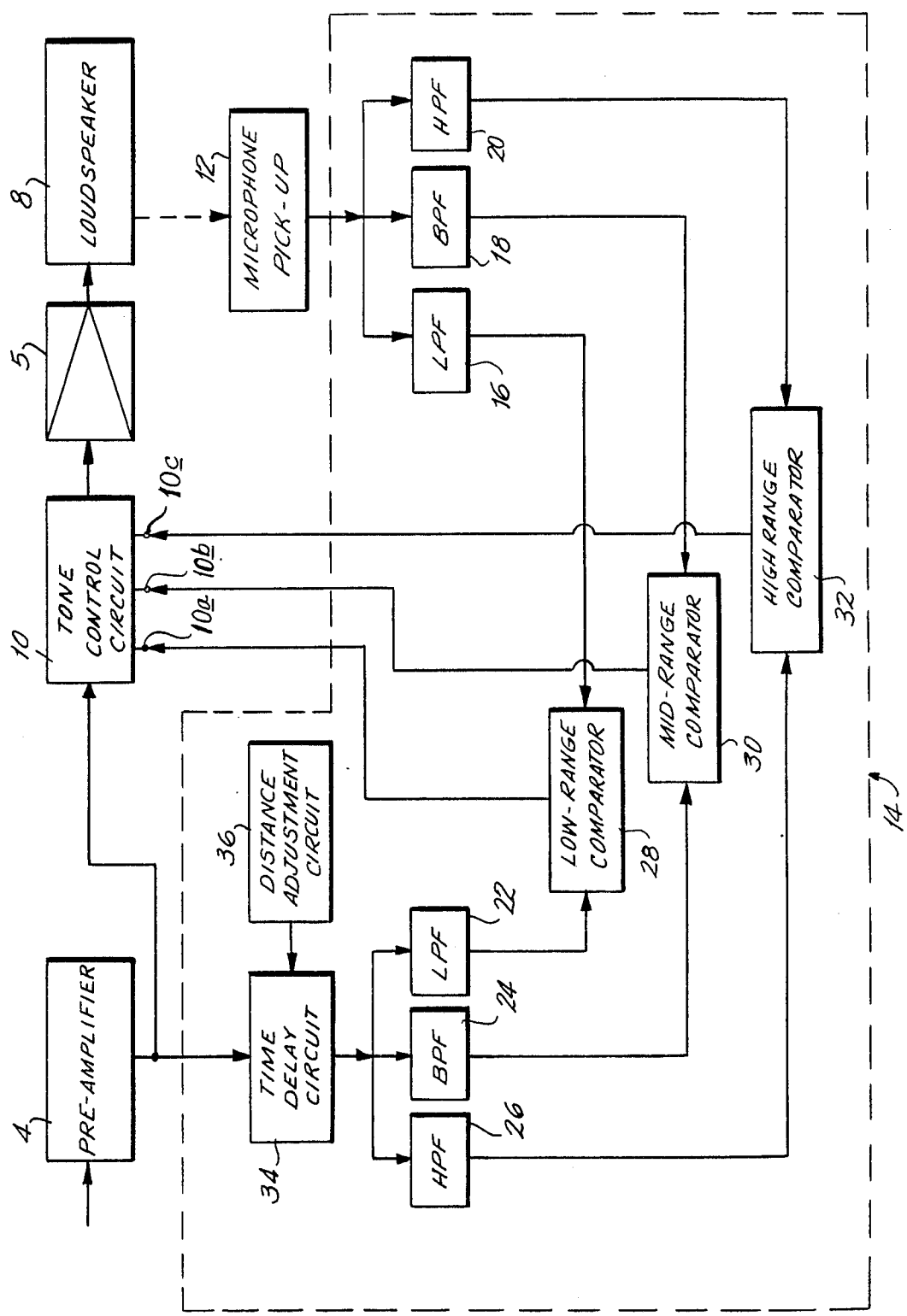
FIG. 2 is a block diagram of an embodiment of an automatic tone adjustment circuit that can be utilized in the audio apparatus of FIG. 1.

Referring now to FIG. 2, there is shown an embodiment of an automatic tone adjustment circuit 14 which can be utilized with the audio apparatus of FIG. 1. As shown in FIG. 2, tone adjustment circuit 14 includes a low pass filter 16, a bandpass filter 18 and a high pass filter 20 receiving the second audio frequency signal from microphone pick-up 12 and separating this signal into respective low-, mid-, and high-frequency ranges. Thus, for example, low pass filter 16 may pass only frequencies below 200 Hz, high pass filter 20 may pass only frequencies above 6 KHz and bandpass filter 18 may pass only frequencies between these two values. In like manner, pre-amplifier 4 supplies the first electrical audio frequency signal to a corresponding low pass filter 22, bandpass filter 24 and highpass filter 26 which separates this signal into corresponding low-, mid-, and high-frequency ranges. The respective signals from low pass filters 16 and 22, bandpass filters 18 and 24 and high pass filters 20 and 26 are compared in respective low-, mid- and high-frequency range comparators 28, 30 and 32 to produce respective compared output or error signals.

Each comparator circuit 28, 30 and 32 may include a sample and hold circuit which averages the respective signals over a predetermined period of time, for example, a few tenths of a second to a few seconds. Such a time averaging arrangement is preferable so as to eliminate tone adjustments due to spurious responses in the respective signals. The compared output or error signals from comparators 28, 30 and 32 are then supplied to terminals 10a, 10b and 10c for relatively adjusting the levels of the low-, mid-, and high-frequency components of the first audio frequency signal so that loudspeaker 8 receives a corrected or compensated signal to accurately reproduce the audio information from source 6.

It is to be noted that there is a delay between the time when pre-amplifier 4 generates the first audio frequency signal and the time when microphone pick-up 12 receives the reproduced acoustic signal and generates the second audio frequency signal. This delay is caused by the transmission of the first audio frequency signal through tone control circuit 10, amplifier 5 and loudspeaker 8 and the propagation time of the sound pressure wave generated by loudspeaker 8. To compensate for this delay and ensure that the reproduced acoustic signal is compared against the actual signal of which it is a product, a variable time delay circuit 34 is interposed between pre-amplifier 4 and filters 22, 24 and 26 to delay the first audio frequency signal. In this manner, comparators 28, 30 and 32 compare the actually reproduced acoustic signal with the first electrical audio frequency signal corresponding thereto to provide an accurate comparison therebetween. Since a substantial part of the time delay results from the propagation of the sound pressure waves from loudspeaker 8 through air to pick-up 12, the delay time should be adjusted in accordance with the distance of microphone pick-up 12 from loudspeaker 8. Thus, a distance adjustment circuit 36, which may be manually actuable, is provided for controlling the amount of delay imparted by delay circuit 34 to the first electrical audio frequency signal from pre-amplifier 4. Distance adjustment circuit 36 may include a variable control (not shown) having settings related to the distance of microphone pick-up 12 to loudspeaker 8 or it may include a two or three position switch with each position corresponding to far, near and intermediate distances.

It is to be realized that the present invention is not limited to the above-described embodiment. Thus, for example, microphone pick-up 12 may be incorporated into the usual housing of pre-amplifier 4 or amplifier 5, or an external microphone may be placed at any convenient point in the room so as to obtain optimum sound balance at that point.

Having described a specific preferred embodiment of the invention and several modifications thereof, it is to be understood that the invention is not limited to such precise embodiment and modifications, and that various changes and further modifications may be effected therein by one skilled in the art without departing from the scope or spirit of the invention as defined in the appended claims.

What is claimed is:

1. An audio apparatus comprising:
    signal generating means for generating a first electrical audio frequency signal corresponding to audio information received from a source;
    loudspeaker means for generating an acoustic signal in response to said first audio frequency signal;
    pick-up means receiving said acoustic signal for generating a corresponding second electrical audio frequency signal;
    automatic tone adjustment means for comparing said first and second audio frequency signals and producing a compared output signal; and
    control means for adjusting a characteristic of said first audio frequency signal as applied to said loudspeaker means, in response to said compared output signal, whereby to ensure accurate acoustic signal generation by said loudspeaker means regardless of room and loudspeaker means design.

2. An audio apparatus according to claim 1; in which said automatic tone adjustment means includes comparator means for comparing said first and second audio frequency signals and providing said compared output signal to said control means in correspondence thereto.

3. An audio apparatus according to claim 2; in which said automatic tone adjustment means includes a first set of filters for separating the first audio frequency signal into low-, mid- and high-frequency ranges and a second set of filters for separating the second audio frequency signal into low-, mid- and high-frequency ranges and said comparator means includes a plurality of comparators for comparing the respective ranges of said first and second audio frequency signals and producing respective compared low-, mid- and high-frequency output signals.

4. An audio apparatus according to claim 3; in which said control means receives said compared low-, mid- and high-frequency output signals for relatively adjusting the levels of respective low-, mid- and high-frequency ranges of said first audio frequency signal.

5. An audio apparatus according to claim 1; in which said automatic tone adjustment means includes delay means for delaying said first audio frequency signal prior to comparison with said second audio frequency signal.

6. An audio apparatus according to claim 5; in which said automatic tone adjustment means includes a distance adjustment mean for controlling the amount of delay imparted by said delay means to said first audio frequency signal in relation to the distance between said pick-up means and said loudspeaker means.

7. In an audio apparatus of the type in which an acoustic signal is generated by transducer means in response to a first electrical audio frequency signal corresponding to audio information received from a source, the combination of:
  pick-up means receiving said acoustic signal for generating a corresponding second electrical audio frequency signal;
  comparator means for comparing said first and second audio frequency signals and producing a compared output signal; and
  control means for adjusting a characteristic of said first audio frequency signal in response to said compared output signal, whereby to ensure accurate acoustic signal generation by said transducer means regardless of room design and transducer means design.

8. An audio apparatus according to claim 7; further comprising a first set of filters for separating the first audio frequency signal into low-, mid- and high-frequency ranges, and a second set of filters for separating the second audio frequency signal into low-, mid- and high-frequency ranges, and in which said comparator means includes a plurality of comparators for comparing the low-, mid- and high-frequency ranges of said first and second audio frequency signals and producing respective compared low-, mid- and high-frequency compared output signals.

9. An audio apparatus according to claim 8; in which said control means receives said compared output signals for relatively adjusting the levels of the respective low-, mid- and high-frequency ranges of said first audio frequency signal.

10. An audio apparatus according to claim 7; further comprising delay means for delaying said first audio frequency signal prior to comparison with said second audio frequency signal.

11. An audio apparatus according to claim 10; further comprising distance adjustment means for controlling the amount of delay imparted by said delay means to said first audio frequency signal.

12. An audio equalizer for use in a system including an audio signal source for providing a first audio signal, and sound reproducing means responsive to a second audio signal for reproducing sounds in accordance therewith, said audio equalizer being responsive to said first audio signal for providing said second audio signal to said sound reproducing means, comprising:
  means responsive to said reproduced sounds and to said first audio signal for determining the difference between the frequency versus amplitude characteristics thereof, and
  means for automatically adjusting the frequency versus amplitude characteristics of said first audio signal in accordance with said determined difference, with the resulting adjusted audio signal being provided to said sound reproducing means as said second audio signal.

13. An audio equalizer as set forth in claim 12, wherein said difference determining means comprises means for determining the time averaged said difference.

14. An audio equalizer as set forth in claim 12, wherein said difference determining means comprises means responsive to said reproduced sounds to provide a third audio signal in accordance therewith, and means for determining the difference between said frequency versus amplitude characteristics of said reproduced sounds and said first audio signal by determining the difference between the frequency versus amplitude characteristics of said first and third audio signals.

15. An audio equalizer as set forth in claim 14, wherein said means for determining the difference between the frequency versus amplitude characteristics of said first and second audio signals comprises means for separating each of said first and second audio signals into a plurality of frequency components, means for comparing the level of each of said frequency components of said first audio signal with the level of the like frequency component of said second audio signal, and means for automatically adjusting the amplitudes of each of said frequency components of said first audio signal in accordance with the results of the corresponding said comparison and for combining the resulting amplitude adjusted frequency components to thereby derive said second audio signal.

16. An audio equalizer as set forth in claim 14, wherein said means for determining the difference between the frequency versus amplitude characteristics of said first and second audio signals comprises means for separating each of said first and second audio signals into a plurality of frequency components, means for comparing the level of each of said frequency components of said first audio signal with the level of the like frequency component of said second audio signal, and means for automatically adjusting the amplitudes of each of said frequency components of said first audio signal in accordance with the results of the corresponding said comparison, and for deriving said second audio signal from the resulting amplitude adjusted frequency components.

17. An audio equalizer for use in an audio system producing audio frequency sounds in a listening environment, comprising:
  first input menas adapated to be responsive to a first audio signal to be equalized,
  output means for providing an equalized audio signal to be used in producing said audio frequency sounds,
  second input means responsive to a second audio signal derived from sounds produced in said listening environment by said audio system, and
  means for, during normal use of said audio system, automatically determining the differences between the frequency versus amplitude characteristics of said first and second audio signals and adjusting the frequency versus amplitude characteristic of said first audio signal in accordance with said determined difference so as to thereby provide said equalized audio signal.

18. A method of automatically equalizing an audio signal during normal operation of a high fidelity sound reproduction system comprising the steps of:

providing a first audio signal, generating an acoustic signal from an equalized said first audio signal, deriving a second audio signal from said acoustic signal, determining, during normal operation, the amplitude versus frequency characteristics of both said first and second audio signals, and automatically modifying the frequency versus amplitude characteristic of said first audio signal in accordance with the difference between said determined amplitude versus frequency characteristics of said first and second audio signals to thus provide said equalized first audio signal for use in generating said acoustic signal.

* * * * *